US012696462B2

(12) United States Patent
Tachi et al.

(10) Patent No.: US 12,696,462 B2
(45) Date of Patent: Jul. 28, 2026

(54) SEMICONDUCTOR DEVICE AND METHOD FOR MANUFACTURING THE SAME

(71) Applicant: Kioxia Corporation, Tokyo (JP)

(72) Inventors: Kiichi Tachi, Yokkaichi Mie (JP);
Ryota Nihei, Yokkaichi Mie (JP);
Yoshikazu Hosomura, Kamakura
Kanagawa (JP)

(73) Assignee: KIOXIA CORPORATION, Tokyo (JP)

( * ) Notice: Subject to any disclaimer, the term of this
patent is extended or adjusted under 35
U.S.C. 154(b) by 564 days.

(21) Appl. No.: 18/176,557

(22) Filed: Mar. 1, 2023

(65) Prior Publication Data

US 2024/0090239 A1      Mar. 14, 2024

(30) Foreign Application Priority Data

Sep. 14, 2022    (JP) ................................. 2022-146356

(51) Int. Cl.
H01L 23/528          (2006.01)
H01L 21/768          (2006.01)
(Continued)

(52) U.S. Cl.
CPC ............ H10B 80/00 (2023.02); H10W 72/00
(2026.01); H10W 72/536 (2026.01); **H10W
72/922 (2026.01); H10W 72/941** (2026.01);
H10W 72/9415 (2026.01); H10W 72/944
(2026.01); H10W 72/951 (2026.01);
(Continued)

(58) Field of Classification Search
CPC ....... H01L 2224/08145; H01L 2224/85; H01L
24/08; H01L 25/0657; H10B 12/50
See application file for complete search history.

(56) References Cited

U.S. PATENT DOCUMENTS

2020/0266146 A1*    8/2020  Nishida ................... H01L 24/73
2020/0279841 A1*    9/2020  Sanuki .................... H01L 25/50
(Continued)

FOREIGN PATENT DOCUMENTS

JP        2020-141100 A      9/2020
JP        2021-048249 A      3/2021

*Primary Examiner* — Kretelia Graham
*Assistant Examiner* — David J Goodwin
(74) *Attorney, Agent, or Firm* — Foley & Lardner LLP

(57)                    ABSTRACT
A semiconductor device includes a metal layer disposed
above a transistor on a first substrate. The metal layer
includes a first region extending in a first direction and a
second region that has a width in the first direction smaller
than the first region and protrudes from the first region in a
second direction, and has a first corner portion having an
angle larger than 180° as viewed in a third direction between
a proximal end portion of the second region and the first
region. The metal layer includes a first portion that is
disposed within the first region and has a lower surface at a
first height, and a second portion that is disposed within the
second region and has a lower surface at a second height
lower than the first height. A step present at a boundary
between the first portion and the second portion is disposed
away from an edge of the second region at a first position
near the first corner portion in the second direction and
adjacent to the edge of the second region at a second position
away from the first corner portion than the first position.

12 Claims, 12 Drawing Sheets

(51) Int. Cl.

| | |
|---|---|
| *H10B 80/00* | (2023.01) |
| *H10W 72/00* | (2026.01) |
| *H10W 72/50* | (2026.01) |
| *H10W 72/90* | (2026.01) |
| *H10W 80/00* | (2026.01) |
| *H10W 90/00* | (2026.01) |

(52) U.S. Cl.
CPC ........ *H10W 72/952* (2026.01); *H10W 80/312* (2026.01); *H10W 80/327* (2026.01); *H10W 80/333* (2026.01); *H10W 90/792* (2026.01)

(56) References Cited

U.S. PATENT DOCUMENTS

| | | | |
|---|---|---|---|
| 2021/0035965 A1* | 2/2021 | Mizutani | H01L 25/50 |
| 2021/0082877 A1 | 3/2021 | Uchiyama | |
| 2021/0134819 A1* | 5/2021 | Zhang | H01L 23/481 |
| 2023/0275054 A1* | 8/2023 | Jang | H01L 25/18 |
| 2023/0354606 A1* | 11/2023 | Wada | H10B 43/10 |
| 2024/0407171 A1* | 12/2024 | Kim | H10B 80/00 |

* cited by examiner

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2022-146356, filed Sep. 14, 2022, the entire contents of which are incorporated herein by reference.

FIELD

Embodiments described herein relate generally to a semiconductor device and a method for manufacturing the same.

BACKGROUND

A current may be concentrated at a slope of a wire (metal layer) that is present near a corner portion of the wire. When the thickness of the slope of the wire is small, electromigration (EM) failure may occur at the slope.

DESCRIPTION OF THE DRAWINGS

FIG. 3 is a cross-sectional view illustrating a method for manufacturing the semiconductor device of the first embodiment (1/2).

FIG. 6A is a plan view illustrating a structure of a semiconductor device of a comparative example, and FIG. 6B is a plan view illustrating the structure of the semiconductor device of the first embodiment.

DETAILED DESCRIPTION

Embodiments provide a semiconductor device capable of forming a metal layer having a suitable configuration, and a method for manufacturing the semiconductor device.

In general, according to at least one embodiment, a semiconductor device includes a first substrate, a transistor disposed on the first substrate, a memory cell array disposed above the transistor, and a metal layer disposed above the transistor. The metal layer includes a first region extending in a first direction, and a second region that has a width in the first direction smaller than the first region, protrudes from the first region in a second direction intersecting the first direction, and includes a wire connection portion, and has a first corner portion having an angle larger than 180° as viewed in a third direction intersecting the first direction and the second direction between a proximal end portion of the second region and the first region. The metal layer includes a first portion that is disposed within the first region and has a lower surface at a first height, and a second portion that is disposed within the second region and has a lower surface at a second height lower than the first height. A step present at a boundary between the first portion and the second portion is disposed away from an edge of the second region at a first position near the first corner portion in the second direction, and adjacent to the edge of the second region at a second position away from the first corner portion than the first position.

Hereinafter, embodiments will be described with reference to the drawings. In FIGS. 1 to 12, the same components are denoted by the same reference signs, and duplicated description is omitted.

First Embodiment

Figure 1:
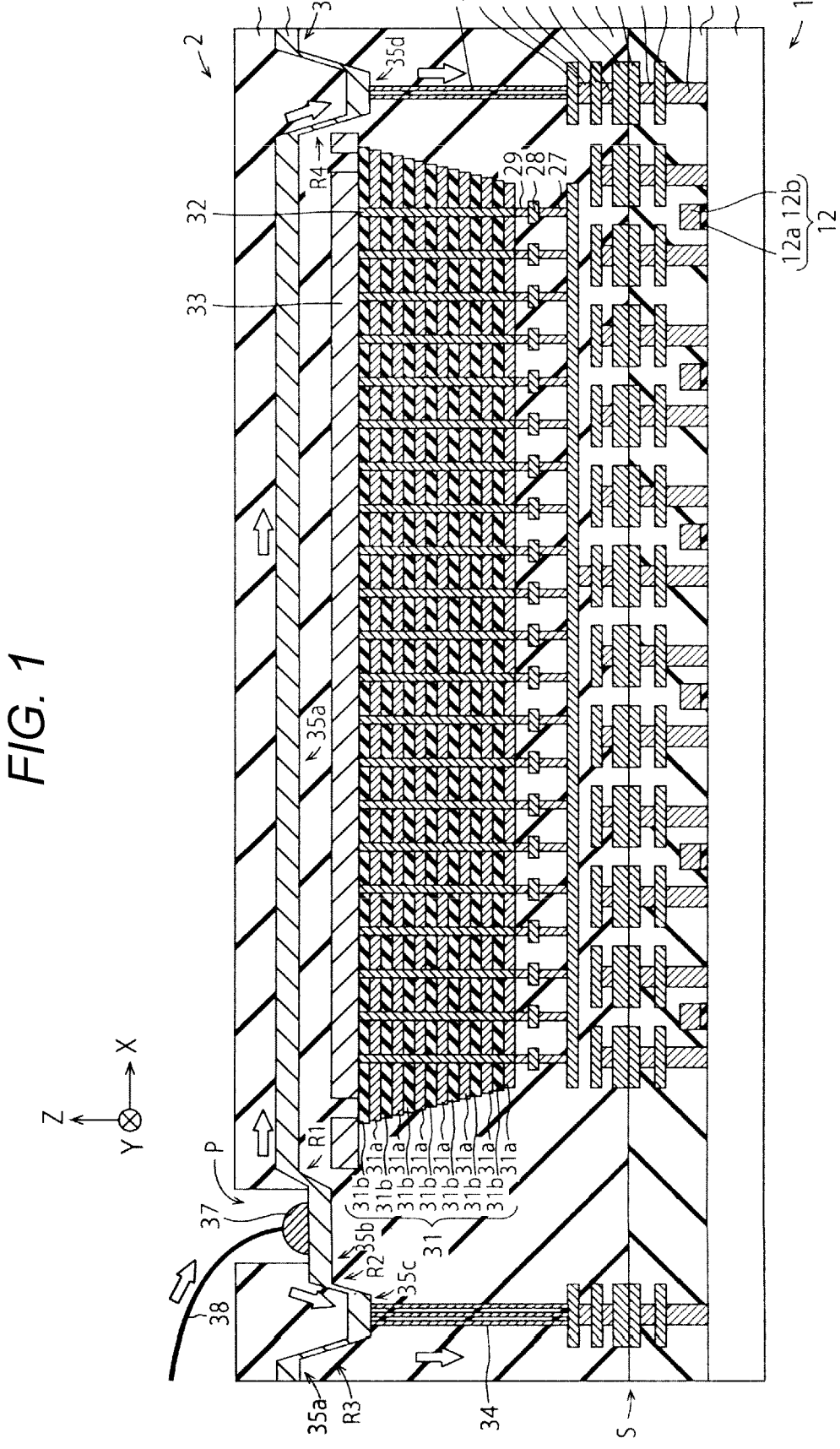
FIG. 1 is a cross-sectional view illustrating a structure of a semiconductor device of a first embodiment.

FIG. 1 is a cross-sectional view illustrating a structure of a semiconductor device of a first embodiment.

The semiconductor device of the embodiment is a three-dimensional semiconductor memory in which a circuit chip 1 is bonded to an array chip 2. A reference sign S shown in FIG. 1 refers to a bonding surface between the circuit chip 1 and the array chip 2.

As illustrated in FIG. 1, the circuit chip 1 includes a substrate 11, a plurality of transistors 12, an interlayer insulating film 13, a plurality of contact plugs 14, a wiring layer 15, a plurality of via plugs 16, and a plurality of metal pads 17. Each of the transistors 12 includes a gate insulating film 12a and a gate electrode 12b. The substrate 11 is an example of a first substrate.

As illustrated in FIG. 1, the array chip 2 includes an interlayer insulating film 21, a plurality of metal pads 22, a plurality of via plugs 23, a wiring layer 24, a plurality of via plugs 25, a wiring layer 26, a plurality of via plugs 27, a wiring layer 28, a plurality of contact plugs 29, a stacked film 31, a plurality of columnar portions 32, a wiring layer 33, a plurality of via plugs 34, a metal wire 35, an insulating passivation film 36, a solder 37, and a bonding wire 38. The stacked film 31 includes a plurality electrode layers 31a and a plurality of insulating films 31b. The metal wire 35 includes a flat portion 35a, a wire connection portion 35b, a plug connection portion 35c, and a plug connection portion 35d. The metal wire 35 is an example of a metal layer. The flat portion 35a, the wire connection portion 35b, the plug connection portion 35c, and the plug connection portion 35d are examples of first, second, third, and fourth portions, respectively.

The substrate 11 is, for example, a semiconductor substrate such as a silicon (Si) substrate. FIG. 1 illustrates X and Y directions that are parallel to a front surface of the substrate 11 and are perpendicular to each other, and a Z direction perpendicular to the front surface of the substrate 11. The X, Y, and Z directions intersect one another. Herein, a +Z direction is used as an upward direction, and a −Z direction is used as a downward direction. The −Z direction may or may not coincide with the gravity direction. The Y direction is an example of a first direction, the −X direction is an example of a second direction, and the Z direction is an example of a third direction.

Each of the transistors 12 includes the gate insulating film 12*a* and the gate electrode 12*b* that are disposed sequentially on the substrate 11, and a source diffusion layer and a drain diffusion layer that are disposed in the substrate 11 and are not shown. The transistors 12 form, for example, a logical circuit (CMOS circuit) that controls the operation of a memory cell array in the array chip 2.

The interlayer insulating film 13 is formed on the substrate 11 so as to cover the transistors 12. The interlayer insulating film 13 is, for example, a stacked film including a silicon oxide film ($SiO_2$ film) and an insulating film other than the $SiO_2$ film.

The contact plugs 14, the wiring layer 15, the via plugs 16, and the metal pads 17 are formed in the interlayer insulating film 13, and are arranged in this order over the substrate 11 (or above the transistors 12). As illustrated in FIG. 1, the wiring layer 15 includes a plurality of wires. Each of the metal pads 17 is, for example, a metal layer including a copper (Cu) layer.

The interlayer insulating film 21 is formed on the interlayer insulating film 13. The interlayer insulating film 21 is, for example, a stacked film including an $SiO_2$ film and an insulating film other than the $SiO_2$ film.

The metal pads 22, the via plugs 23, the wiring layer 24, and the via plugs 25 are formed in the interlayer insulating film 21, and are arranged in this order over the metal pads 17. Each of the metal pads 22 is in contact with the corresponding metal pad 17, and is electrically connected to the corresponding metal pad 17. Each of the metal pads 22 is, for example, a metal layer including a Cu layer. As illustrated in FIG. 1, each of the wiring layers 24 and 26 includes a plurality of wires.

The via plugs 27, the wiring layer 28, and the contact plugs 29 are formed in the interlayer insulating film 21, and are arranged in this order over the wiring layer 26. As illustrated in FIG. 1, the wiring layer 28 includes a plurality of wires. The wires include a plurality of bit lines.

The stacked film 31, the columnar portions 32, and the wiring layer 33 are formed in the interlayer insulating film 21, to form the memory cell array. The memory cell array includes a plurality of memory cells, in which data can be stored. The operation of the memory cell array is controlled by the logical circuit through the metal pads 17 and 22 and the like.

The stacked film 31 includes the electrode layers 31*a* and the insulating films 31*b* that are alternately stacked in the Z direction. Each of the electrode layers 31*a* is, for example, a metal layer including a tungsten (W) layer, and functions as a word line or a selection line. The insulating films 31*b* are, for example, a $SiO_2$ film.

The columnar portions 32 are formed on the contact plugs 29 in the stacked film 31, and have a columnar shape extending in the Z direction. The lower end of each of the columnar portions 32 is electrically connected to the corresponding bit line, and the upper end of each of the columnar portions 32 is electrically connected to a source line described below. Details of the columnar portions 32 will be described below.

The wiring layer 33 include a plurality of wires as illustrated in FIG. 1. Among the wires, the wire arranged on the columnar portions 32 functions as a source line.

The via plugs 34 are formed in the interlayer insulating film 21, and are arranged on the wiring layer 26. The metal wire 35 is formed on the interlayer insulating film 21 and the via plugs 34. The metal wire 35 is, for example, a wire including an aluminum (Al) layer. The insulating passivation film 36 is formed over the interlayer insulating film 21 through the metal wire 35. As illustrated in FIG. 1, the insulating passivation film 36 has an opening P.

The metal wire 35 includes the flat portion 35*a*, the wire connection portion 35*b*, the plug connection portion 35*c*, and the plug connection portion 35*d*. The metal wire 35 further includes slopes R1, R2, R3, and R4. The slope R1 is an example of a first slope, and the slope R2 is an example of a second slope.

The flat portion 35*a* is mostly disposed above the stacked film 31, the columnar portions 32, and the wiring layer 33, and has a flat upper surface and a flat lower surface. The height (Z coordinate) of the lower surface of the flat portion 35*a* is an example of a first height. The flat portion 35*a* of the embodiment occupies the most of the area of the metal wire 35 as viewed in plan view, that is, occupies the most of the area of the metal wire 35 as viewed in the Z direction.

The wire connection portion 35*b* is disposed at a lower position than the flat portion 35*a*. The upper surface and the lower surface of the wire connection portion 35*b* illustrated in FIG. 1 are disposed at lower heights than the upper surface and the lower surface of the flat portion 35*a*, respectively. The height of the lower surface of the wire connection portion 35*b* is an example of a second height. The slope R1 connects the flat portion 35*a* to the wire connection portion 35*b* as illustrated in FIG. 1, and is tilted with respect to an XY plane between the flat portion 35*a* and the wire connection portion 35*b*.

The wire connection portion 35*b* is disposed for wire bonding. In FIG. 1, the upper surface of the wire connection portion 35*b* is exposed in the opening P, and the bonding wire 38 is electrically connected to the upper surface of the wire connection portion 35*b* in the opening P through the solder 37. The bonding wire 38 is used, for example, to electrically connect the semiconductor device of the embodiment to another device. In FIG. 1, a flow of current supplied from the bonding wire 38 is represented by a white arrow on black.

The plug connection portion 35*c* is disposed at a lower position than the wire connection portion 35*b*. The upper surface and the lower surface of the plug connection portion 35*c* illustrated in FIG. 1 are disposed at lower heights than the upper surface and the lower surface of the wire connection portion 35*b*, respectively. The height of the lower surface of the plug connection portion 35*c* is an example of a third height. The slope R2 connects the wire connection portion 35*b* to the plug connection portion 35*c* as illustrated in FIG. 1, and is tilted with respect to the XY plane between the wire connection portion 35*b* and the plug connection portion 35*c*. The slope R3 connects the flat portion 35*a* to the plug connection portion 35*c* as illustrated in FIG. 1, and is tilted with respect to the XY plane between the flat portion 35*a* and the plug connection portion 35*c*.

The plug connection portion 35*c* is disposed for plug connection. In FIG. 1, the plug connection portion 35*c* is disposed on the via plugs 34, and is electrically connected to the via plugs 34. The via plugs 34 are an example of a first via plug.

The plug connection portion 35*d* is disposed at a lower position than the flat portion 35*a*. The upper surface and the lower surface of the plug connection portion 35*d* illustrated in FIG. 1 are disposed at lower heights than the upper surface and the lower surface of the flat portion 35*a*, respectively. Specifically, the upper surface and the lower surface of the plug connection portion 35*d* illustrated in FIG. 1 are disposed at the same heights as those of the upper surface and the lower surface of the plug connection portion 35*c*, respectively. The height of the lower surface of the plug connection portion 35*d* is an example of a fourth height. The slope R4 connects the flat portion 35*a* to the plug connection portion 35*d* as illustrated in FIG. 1, and is tilted with respect to the XY plane between the flat portion 35*a* and the plug connection portion 35*d*.

The plug connection portion 35*d* is disposed for plug connection. In FIG. 1, the plug connection portion 35*d* is disposed on the via plugs 34, and is electrically connected to the via plugs 34. The via plugs 34 are an example of a second via plug.

In the metal wire 35 of at least one embodiment, the thicknesses of the flat portion 35*a*, the wire connection portion 35*b*, the plug connection portion 35*c*, and the plug connection portion 35*d* are large, and the thicknesses of the slopes R1 to R4 are small as illustrated in FIG. 1. Details of the metal wire 35 will be described below.

Figure 2:
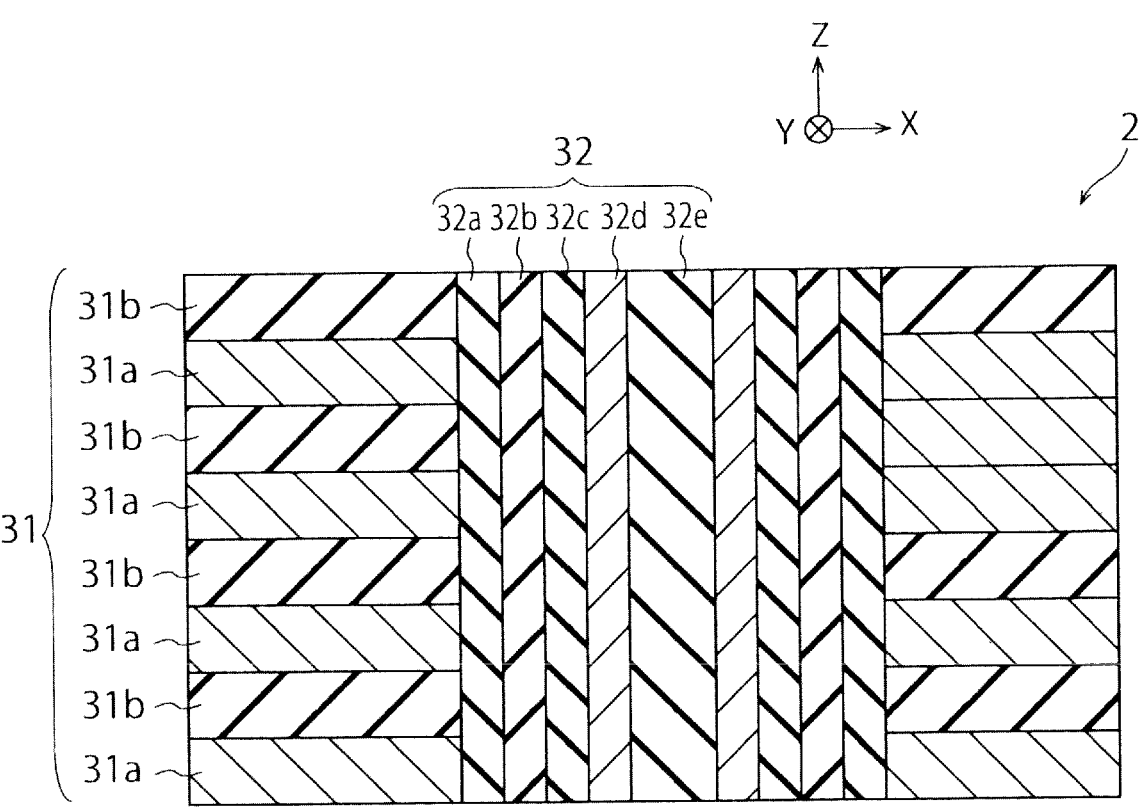
FIG. 2 is an enlarged cross-sectional view illustrating the structure of the semiconductor device of the first embodiment.

FIG. 2 is an enlarged cross-sectional view illustrating the structure of the semiconductor device of the first embodiment. FIG. 2 illustrates one of the columnar portions 32 described above.

Each of the columnar portions 32 of the embodiment includes a block insulating film 32*a*, a charge storage layer 32*b*, a tunnel insulating film 32*c*, a channel semiconductor layer 32*d*, and a core insulating film 32*e* that are arranged in this order in the stacked film 31.

The block insulating film 32*a*, the charge storage layer 32*b*, the tunnel insulating film 32*c*, and the channel semiconductor layer 32*d* have a tubular shape extending in the Z direction, and the core insulating film 32*e* has a columnar shape extending in the Z direction. The block insulating film 32*a* is, for example, a $SiO_2$ film. The charge storage layer 32*b* is, for example, an insulating film such as a silicon nitride film (SiN film) or a semiconductor layer such as a polysilicon layer. The charge storage layer 32*b* allows a signal charge of each memory cell to be stored. The tunnel insulating film 32*c* is, for example, a $SiO_2$ film. The channel semiconductor layer 32*d* is, for example, a polysilicon layer. The channel semiconductor layer 32*d* is electrically connected to the bit line (wiring layer 28) and the source line (wiring layer 33). The core insulating film 32*e* is, for example, a $SiO_2$ film.

Figure 3:
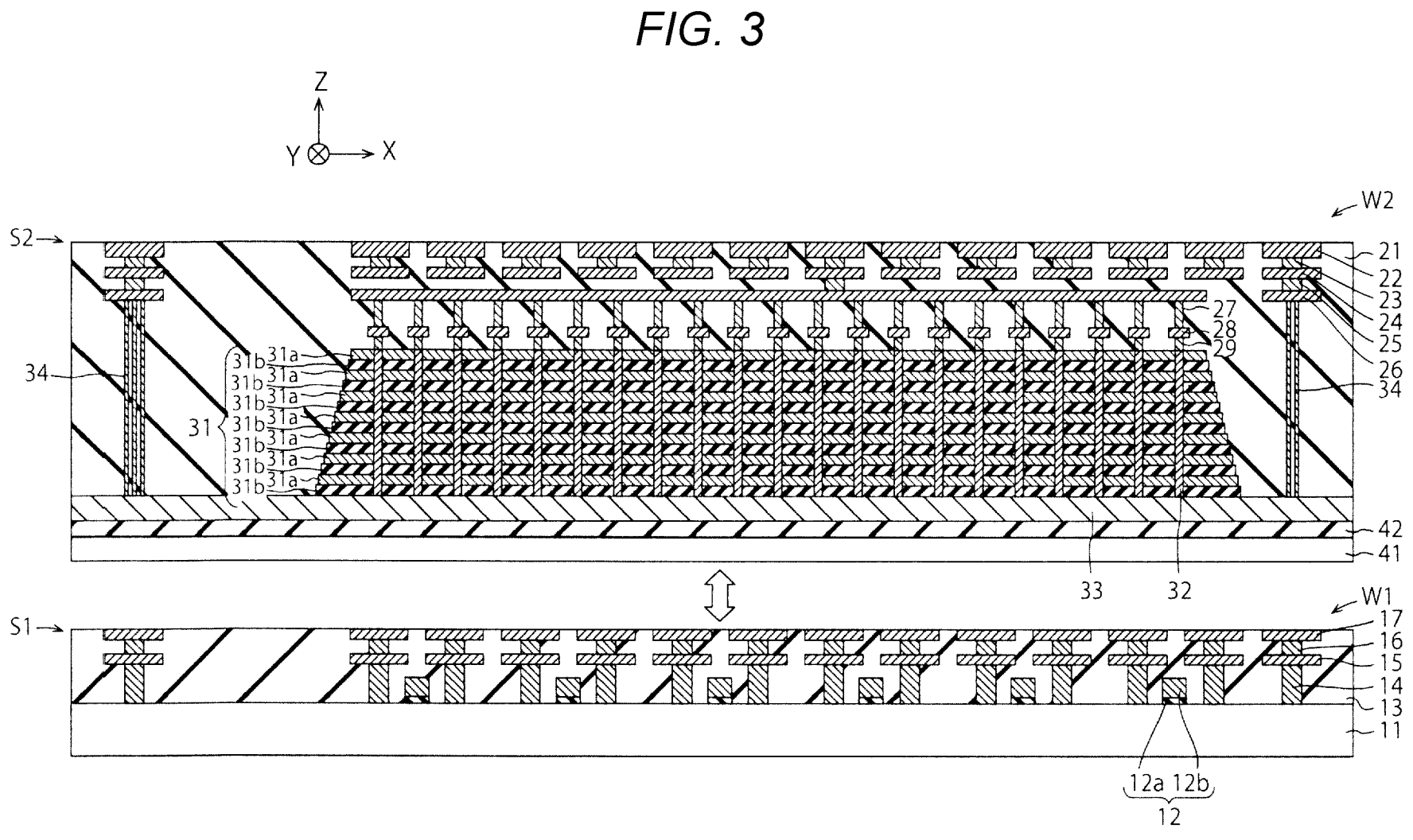
Figure 4:
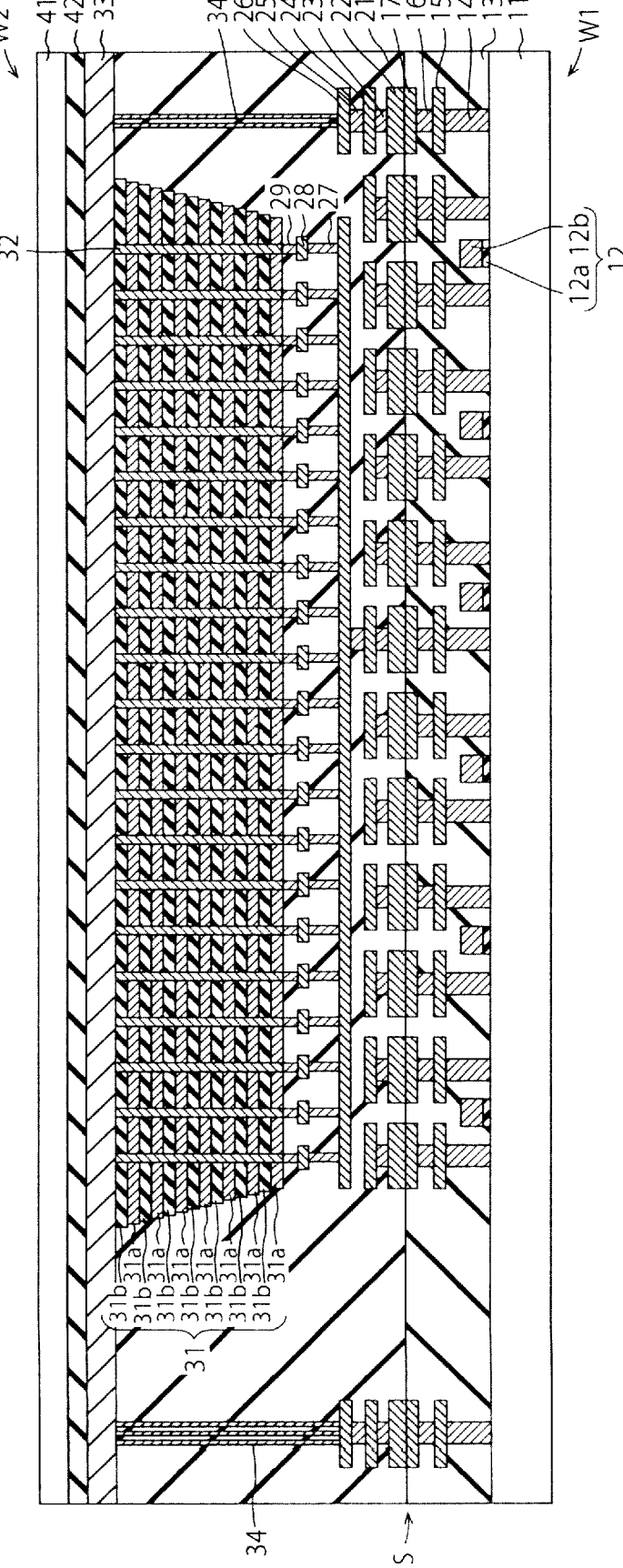
FIG. 4 is a cross-sectional view illustrating the method for manufacturing the semiconductor device of the first embodiment (2/2).

FIGS. 3 and 4 are cross-sectional views illustrating a method for manufacturing the semiconductor device of the first embodiment.

FIG. 3 illustrates a circuit wafer W1 including a plurality of circuit chips 1 and an array wafer W2 including a plurality of array chips 2. The direction of the array wafer W2 illustrated in FIG. 3 is opposite to the direction of the array chip 2 illustrated in FIG. 1. In the embodiment, the circuit wafer W1 is bonded to the array wafer W2 to manufacture the semiconductor device. FIG. 3 illustrates the array wafer W2 before the direction is inverted for bonding. FIG. 1 illustrates the array chip 2 after the direction is inverted for bonding and bonding and dicing are performed.

In FIG. 3, a reference sign S1 refers to the upper surface of the circuit wafer W1, and a reference sign S2 refers to the upper surface of the array wafer W2. The array wafer W2 includes a substrate 41 that is disposed through an insulating film 42 below the wiring layer 33. The substrate 41 is, for example, a semiconductor substrate such as a Si substrate. The substrate 41 is an example of a second substrate.

In at least one embodiment, the transistors 12, the interlayer insulating film 13, the metal pads 17, and the like are formed over the substrate 11 of the circuit wafer W1, and the insulating film 21, the metal pads 22, the stacked film 31, the columnar portions 32, the wiring layer 33, the via plugs 34, the insulating film 42, and the like are formed over the substrate 41 of the array wafer W2, as illustrated in FIG. 3. Subsequently, the circuit wafer W1 is bonded to the array wafer W2 under a mechanical pressure as illustrated in FIG. 4. Thus, the interlayer insulating film 13 is attached to the interlayer insulating film 21. The circuit wafer W1 and the array wafer W2 are then annealed. Thus, the metal pads 17 are bonded to the metal pads 22.

Subsequently, the thickness of the substrate 11 is decreased by chemical mechanical polishing (CMP), the substrate 41 and the insulating film 42 are removed by CMP, the wiring layer 33 is etched, and the metal wire 35, the insulating passivation film 36, the solder 37, and the bonding wire 38 are formed and arranged over the substrate 11. The circuit wafer W1 and the array wafer W2 are cut into a plurality of chips. Thus, the semiconductor device illustrated in FIG. 1 is manufactured.

Although FIG. 1 illustrates a boundary surface between the interlayer insulating films 13 and 21 and a boundary surface between the metal pads 17 and 22, the boundary surfaces are not typically observed after the annealing. However, positions of the boundary surfaces can be estimated, for example, by detecting tilts of side surfaces of the metal pads 17 and 22, or position displacements between the side surfaces of the metal pads 17 and 22.

In at least one embodiment, the circuit chip 1 is bonded to the array chip 2. Instead, the array chip 2 may be bonded to another array chip 2.

In at least one embodiment, the substrate 41 is removed by CMP. However, the substrate 41 may be peeled at the position of the insulating film 42 from the substrate 11 for removal. For example, this makes it possible to reuse the substrate 41.

Next, details of the metal wire 35 of at least one embodiment will be described with reference to FIGS. 5 to 7.

Figure 5:
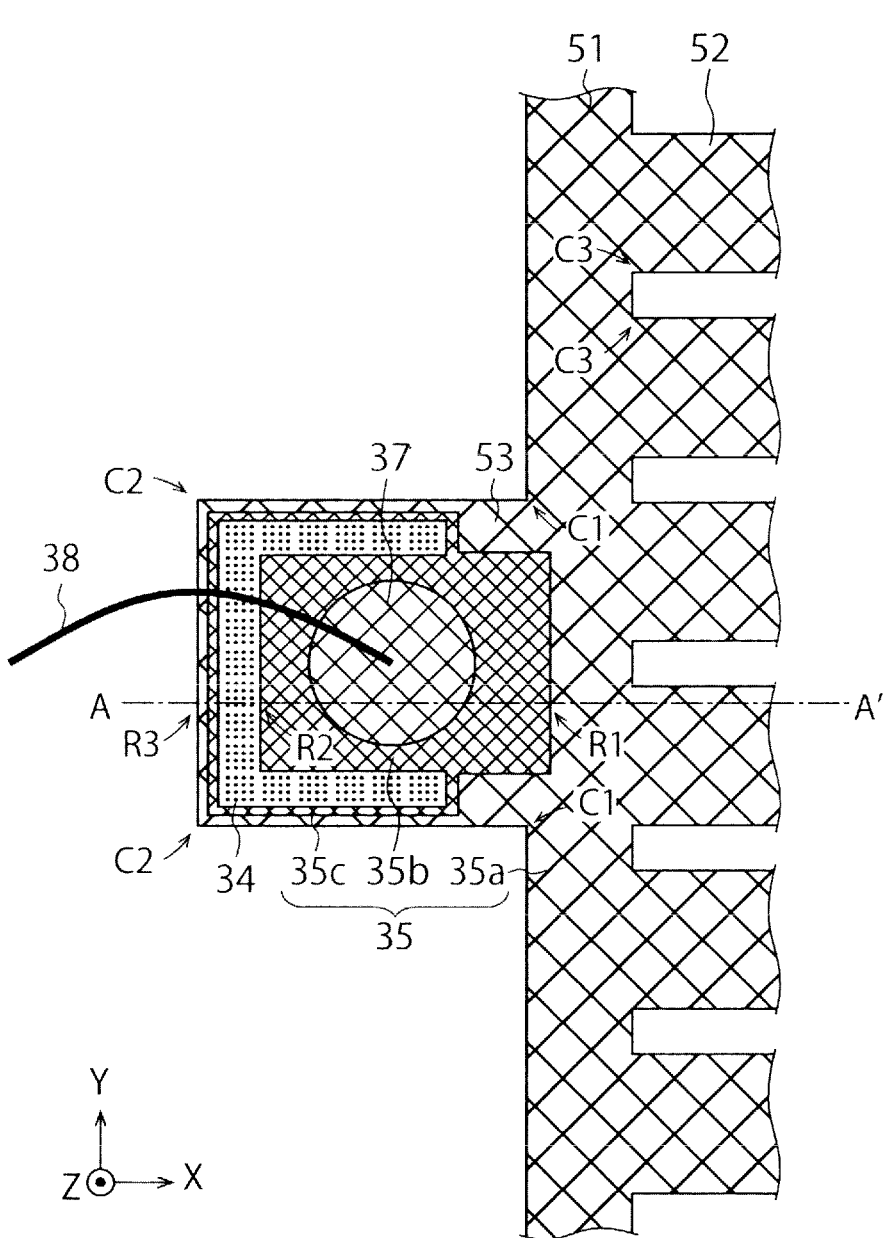
FIG. 5 is a plan view illustrating the structure of the semiconductor device of the first embodiment.

FIG. 5 is a plan view illustrating the structure of the semiconductor device of the first embodiment.

FIG. 5 illustrates a plane profile of the via plugs 34, the metal wire 35, the solder 37, and the bonding wire 38. FIG. 1 is a cross-sectional view taken along line A-A' in FIG. 5. In FIG. 5, the flat portion 35*a*, the wire connection portion 35*b*, and the solder 37 are indicated by cross hatching, and the slopes R1 to R3 are indicated by border lines between the flat portion 35*a*, the wire connection portion 35*b*, and the plug connection portion 35*c*.

The metal wire 35 of the embodiment includes a region 51, a plurality of regions 52, and a region 53, as illustrated in FIG. 5. The regions 51, 52, and 53 are examples of first, third, and second regions, respectively.

The region 51 extends in the Y direction. The regions 52 extend in the X direction from the region 51, and are adjacent to each other in the Y direction. The region 53 is disposed on a side opposite to the regions 52 with respected to the region 51, and protrudes in the –X direction from region 51. The flat portion 35*a* is mostly disposed within the regions 51 and 52. The wire connection portion 35*b* is mostly disposed within the region 53. The plug connection portion 35*c* is disposed within the region 53. The solder 37 is disposed on the wire connection portion 35*b*. The via plugs 34 are disposed under the plug connection portion 35*c*.

The width in the Y direction of the region 53 is smaller than the width in the Y direction of the region 51. In at least one embodiment, the end in the +Y direction of the region 51 is disposed in the +Y direction beyond the range shown on paper sheet. The end in the −Y direction of the region 51 is disposed in the −Y direction beyond the range shown on the paper sheet. In FIG. 5, the width in the X direction of the region 53 is larger than the width in the X direction of the region 51, but may be smaller than the width in the X direction of the region 51.

The metal wire 35 of at least one embodiment further includes a plurality of corner portions C1, a plurality of corner portions C2, and a plurality of corner portion C3, as illustrated in FIG. 5. The corner portions C1 and C2 are examples of first and second corner portions, respectively.

The corner portions C1 are disposed on the region 53, and specifically are disposed at a boundary between the regions 51 and 53. Each of the corner portions C1 has an angle larger than 180° as viewed in plan view. Thus, each of the corner portions C1 has an obtuse angle. The angle of each of the corner portions C1 is, for example, 270°. Each of the corner portions C1 is disposed between a proximal end portion of the region 53 and the region 51.

The corner portions C2 are disposed on the region 53. Each of the corner portions C2 has an angle smaller than 180° as viewed in plan view. Thus, each of the corner portions C2 has an acute angle. The angle of each of the corner portions C2 is, for example, 90°. Each of the corner portions C2 is disposed at a tip end of the region 53.

The corner portions C3 are disposed on the regions 52, and specifically are disposed at boundaries between the regions 51 and 52. Each of the corner portions C3 has an angle larger than 180° as viewed in plan view. Thus, each of the corner portions C3 has an obtuse angle. The angle of each of the corner portions C3 is, for example, 270°. Each of the corner portions C3 is disposed between the proximal end portion of the region 52 and the region 51.

The wire connection portion 35b of the embodiment has a shape similar to a rectangle (oblong) as viewed in plan view, and specifically has such a shape that portions near the corner portions C1 are cut out from the oblong. That is, the planar shape of the wire connection portion 35b is an octagon in which corners on sides of the corner portions C1 are depressed. Therefore, the wire connection portion 35b is disposed away from each of the corner portions C1 and close to each of the corner portions C2. The distance between the wire connection portion 35b and each of the corner portions C1 is longer than the distance between the wire connection portion 35b and each of the corner portions C2 as viewed in plan view. The distance between the wire connection portion 35b and each of the corner portions C1 as viewed in a plan view is, for example, 1 μm or more.

The plug connection portion 35c of the embodiment is disposed in the wire connection portion 35b as viewed in plan view, and has a U-shaped planar shape along the contour of the wire connection portion 35b. Therefore, the plug connection portion 35c is also disposed away from each of the corner portions C1 and close to each of the corner portions C2. The distance between the plug connection portion 35c and each of the corner portions C1 is longer than the distance between the plug connection portion 35c and each of the corner portions C2 as viewed in plan view. The distance between the plug connection portion 35c and each of the corner portions C1 as viewed in a plan view is, for example, 1 μm or more.

The wire connection portion 35b and the plug connection portion 35c of at least one embodiment are disposed away from each of the corner portions C3. The distance between the wire connection portion 35b and each of the corner portions C3 as viewed in a plan view and the distance between the plug connection portion 35c and each of the corner portions C3 as viewed in a plan view are, for example, 1 μm or more.

FIG. 5 illustrates the corner portion C1 disposed at an edge (upper edge) in the +Y direction of the region 53, and the corner portion C1 disposed at an edge (lower edge) in the −Y direction of the region 53. A step present at a boundary between the flat portion 35a and the wire connection portion 35b is disposed away from the upper edge of the region 53 at a first step position near the former corner portion C1, and adjacent to the upper edge of the region 53 at a second step position away from the former corner portion C1 than the first step position. Similarly, the step present at the boundary between the flat portion 35a and the wire connection portion 35b is disposed away from the lower edge of the region 53 at a third step position near the latter corner portion C1 in the Y direction, and adjacent to the lower edge of the region 53 at a fourth step position away from the latter corner portion C1 than the third step position. This is because the wire connection portion 35b of the embodiment has such a shape that portions near the corner portions C1 are cut out from the oblong. The first and third step positions are an example of the first position, and the second and fourth step positions are an example of the second position. In at least one embodiment, the step present at the boundary between the flat portion 35a and the wire connection portion 35b is the slope R1.

The metal wire 35 of the embodiment is, for example, a power supply wire for supplying a power supply voltage such as VCC voltage. In this case, the wire connection portion 35b functions as a power supply pad to which a power supply voltage is supplied from the bonding wire 38. The wiring layer including the metal wire 35 may include a metal wire (signal wire) for supplying an electrical signal such as an input signal and an output signal, and the signal wire may include an input/output (I/O) pad that is electrically connected to the bonding wire. In this case, the wiring layer forms the power supply wire (metal wire 35) and the signal wire.

Figures 6A, 6B:
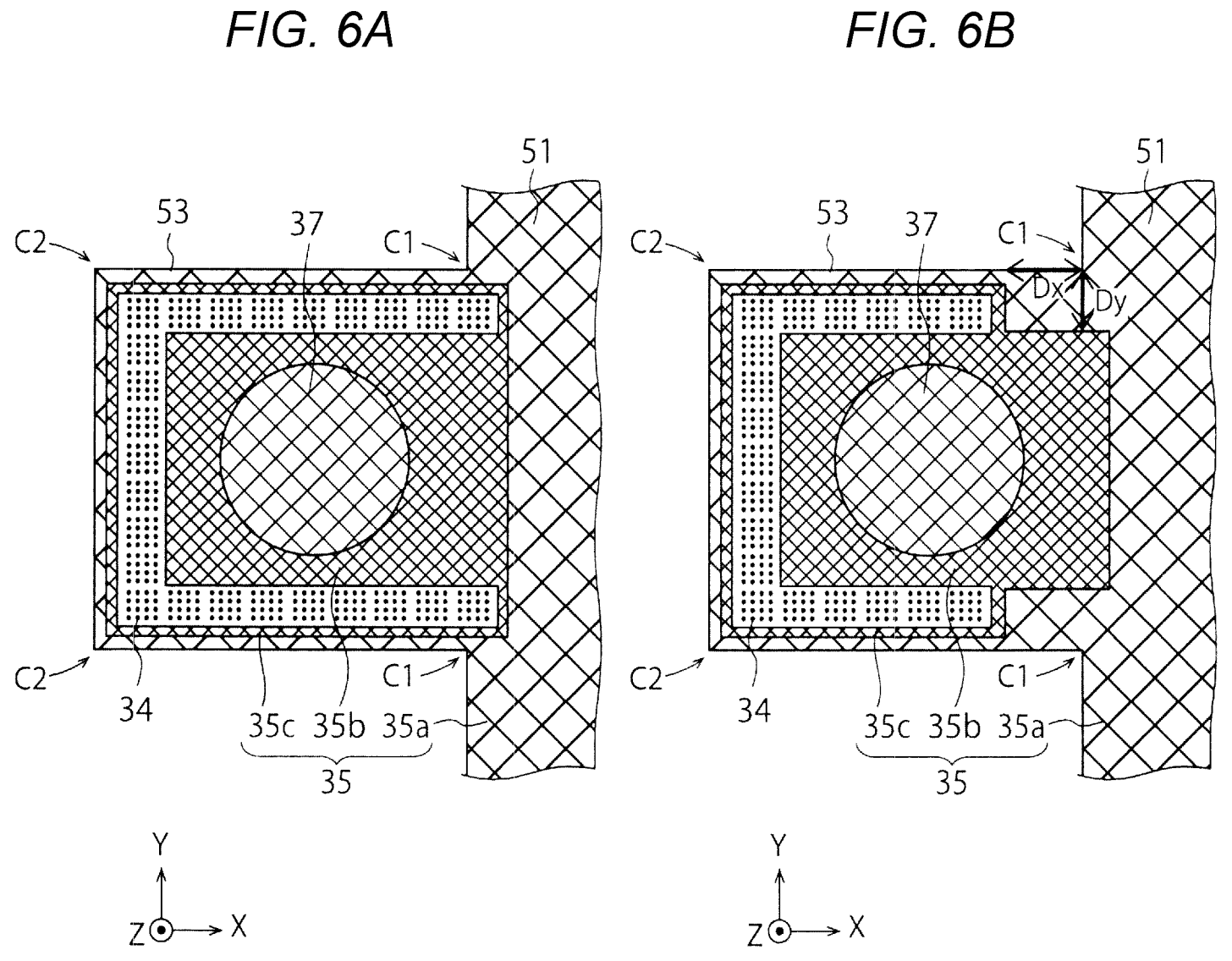

FIG. 6A is a plan view illustrating a structure of a semiconductor device of a comparative example, and FIG. 6B is a plan view illustrating the structure of the semiconductor device of the first embodiment.

FIG. 6A illustrates a metal wire 35 in the semiconductor device of the comparative example. The shape of the metal wire 35 of the comparative example is substantially the same as the shape of the metal wire 35 of the first embodiment. The planar shape of the wire connection portion 35b of the comparative example is a rectangle, but not an octagon. Therefore, the wire connection portion 35b is disposed close to each of the corner portions C1. The plug connection portion 35c of the comparative example has an U-shaped planar shape along the contour of the rectangle. Therefore, the plug connection portion 35c is disposed close to each of the corner portions C1.

From a result of simulation, it is seen that a current is concentrated in the proximity of a corner portion having an obtuse angle in the metal wire 35 of the comparative example. Therefore, a current is concentrated in the proximity of the corner portions C1 and C3. On the other hand, since the metal wire 35 of the comparative example includes the wire connection portion 35b and the plug connection portion 35c near the corner portions C1, the metal wire 35 includes the slopes R1 to R3 near the corner portions C1. Therefore, a current may be concentrated at the slopes R1 to R3. In this case, when the thicknesses of the slopes R1 to R3 of the metal wire 35 are small, EM failure may occur at the slopes R1 to R3. This problem easily occurs when the metal wire 35 is a power supply wire.

FIG. 6B illustrates the metal wire 35 in the semiconductor device of the embodiment. The planar shape of the wire connection portion 35b of the embodiment is an octagon in which corners on sides of the corner portions C1 are depressed. Therefore, the wire connection portion 35b is disposed away from each of the corner portions C1. The planar shape of the plug connection portion 35c of the embodiment except for the depressed portions is a U-shaped planar shape along the contour of the octagon. Therefore, the plug connection portion 35c is also disposed away from each of the corner portions C1.

From a result of simulation, it is seen that a current is concentrated also in the proximity of a corner portion having an obtuse angle in the metal wire 35 of the embodiment. Therefore, a current is concentrated in the proximity of the corner portions C1 and C3. However, since the wire connection portion 35b and the plug connection portion 35c of the embodiment are disposed away from the corner portions C1, the metal wire 35 of the embodiment does not include the slopes R1 to R3 near the corner portions C1. Therefore, according to the embodiment, the concentration of current at the slopes R1 to R3 can be reduced. Accordingly, when the thicknesses of the slopes R1 to R3 of the metal wire 35 are small, the occurrence of EM failure at the slopes R1 to R3 can be reduced. Preferably, this configuration is adapted when the metal wire 35 is a power supply wire.

FIG. 6B illustrates a distance Dx in the X direction between the corner portions C1 and the wire connection portion 35b, and a distance Dy in the Y direction between corner portions C1 and the wire connection portion 35b, as viewed in plan view. In the embodiment, the distances Dx and Dy are 1 μm or more, and preferably 10 μm or more. In the embodiment, the distance Dy is shorter than the distance Dx, and therefore the distance Dy represents a distance between the corner portions C1 and the wire connection portion 35b. On the contrary, the distance Dy may be longer than the distance Dx.

In the embodiment, a part of the flat portion 35a is disposed within the region 53, and a part of the wire connection portion 35b is disposed within the region 51. The wire connection portion 35b may be disposed only within the region 53, similarly to the plug connection portion 35c.

Figures 7A, 7B:
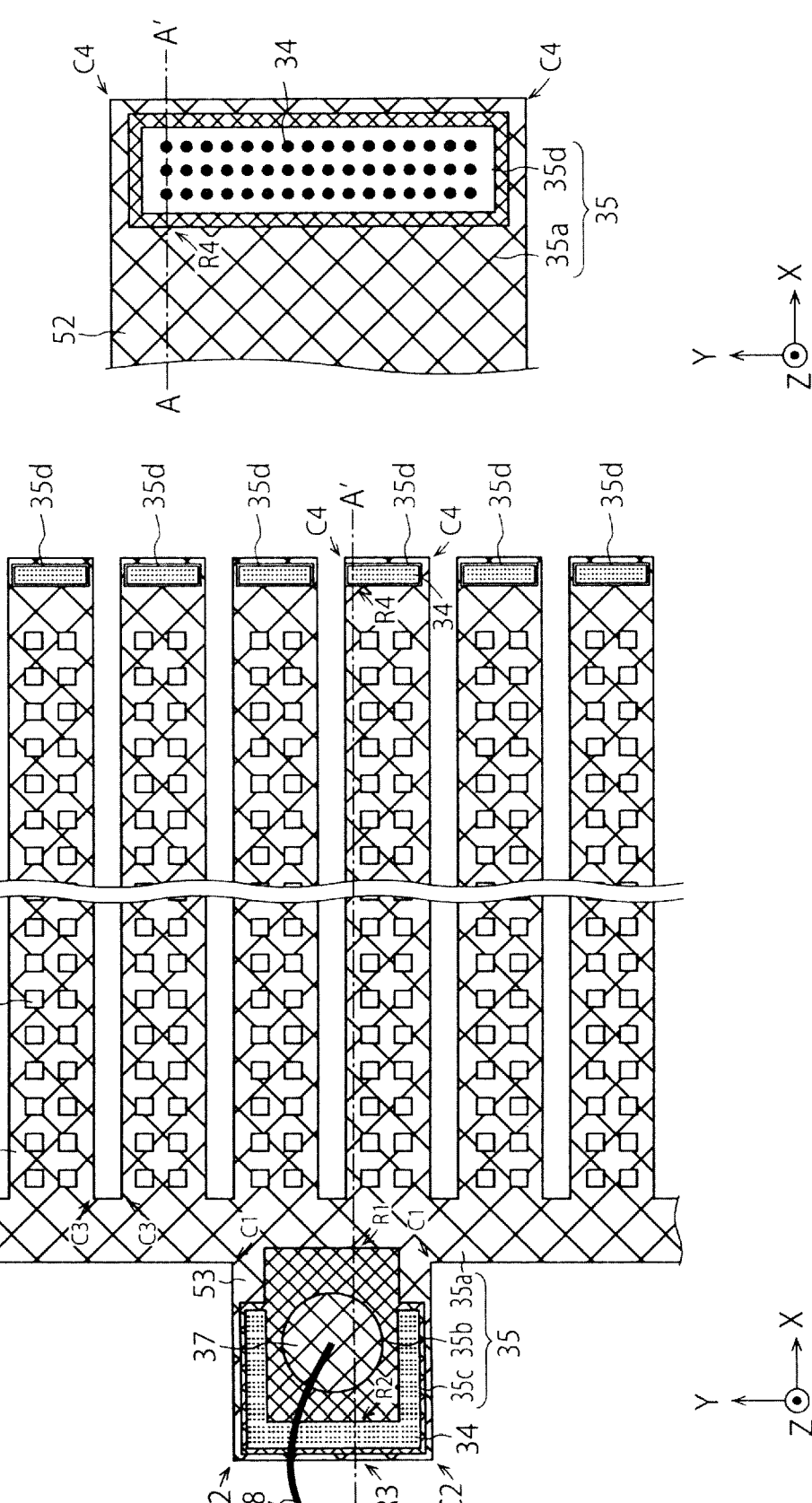
FIGS. 7A and 7B are plan views illustrating the structure of the semiconductor device of the first embodiment.

FIGS. 7A and 7B are plan views illustrating the structure of the semiconductor device of the first embodiment.

FIG. 7A illustrates a plane profile of the via plugs 34, the metal wire 35, the solder 37, and the bonding wire 38, similarly to FIG. 5. However, FIG. 5 illustrates only a part of the regions 52, and FIG. 7A illustrates the whole of the regions 52.

As illustrated in FIG. 7A, each of the regions 52 of the embodiment has a plurality of openings H that penetrate the metal wire 35. For example, the openings H are filled with the insulating passivation film 36 (FIG. 1). As illustrated in FIG. 7A, each of the regions 52 of the embodiment has further includes the plug connection portion 35d near the end in the X direction of each of the regions 52.

FIG. 7B illustrates one of a plurality of the plug connection portions 35d of the embodiment. As illustrated in FIG. 7B, the semiconductor device of the embodiment includes the via plugs 34 under each of the plug connection portions 35d. As illustrated in FIG. 7B, the metal wire 35 of the embodiment includes a plurality of corner portions C4 within each of the regions 52. Each of the corner portions C4 has an angle smaller than 180° as viewed in plan view. Thus, each of the corner portions C4 has an acute angle. The angle of each of the corner portions C4 is, for example, 90°.

As described above, the metal wire 35 of the embodiment includes the wire connection portion 35b and the plug connection portion 35c at positions away from the corner portions C1 having an obtuse angle. Therefore, according to the embodiment, for example, the concentration of current at the slopes R1 to R3 can be reduced. Accordingly, the metal wire 35 having a suitable configuration can be formed.

Second Embodiment

FIGS. 8 to 12 are cross-sectional views illustrating a method for manufacturing a semiconductor device of a second embodiment. The method for manufacturing a semiconductor device illustrated in FIGS. 8 to 12 corresponds to an example of the method for manufacturing the semiconductor device illustrated in FIGS. 3 and 4.

Figure 8A:
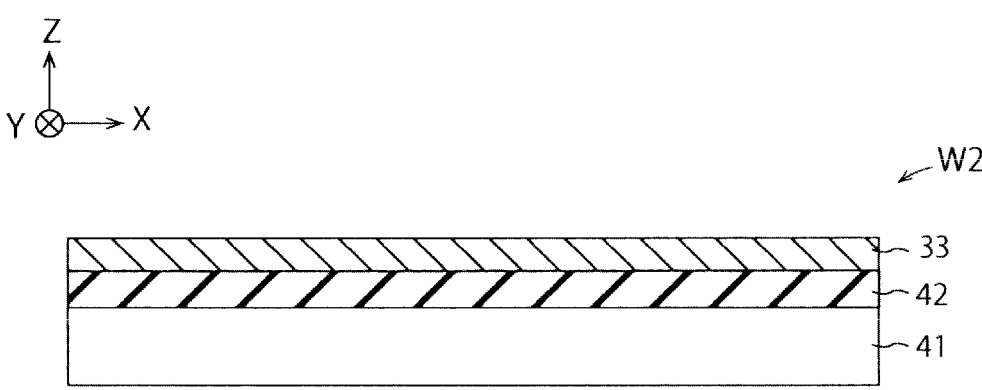
FIGS. 8A and 8B are cross-sectional views illustrating a method for manufacturing a semiconductor device of a second embodiment (1/5).

The substrate 41 for the array wafer W2 is prepared, and the insulating film 42 and the wiring layer 33 are formed sequentially on the substrate 41 (FIG. 8A). The insulating film 42 is, for example, a $SiO_2$ film. The wiring layer 33 is, for example, a polysilicon layer.

Figure 8B:
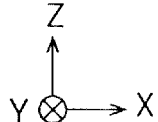
Figure 8B:
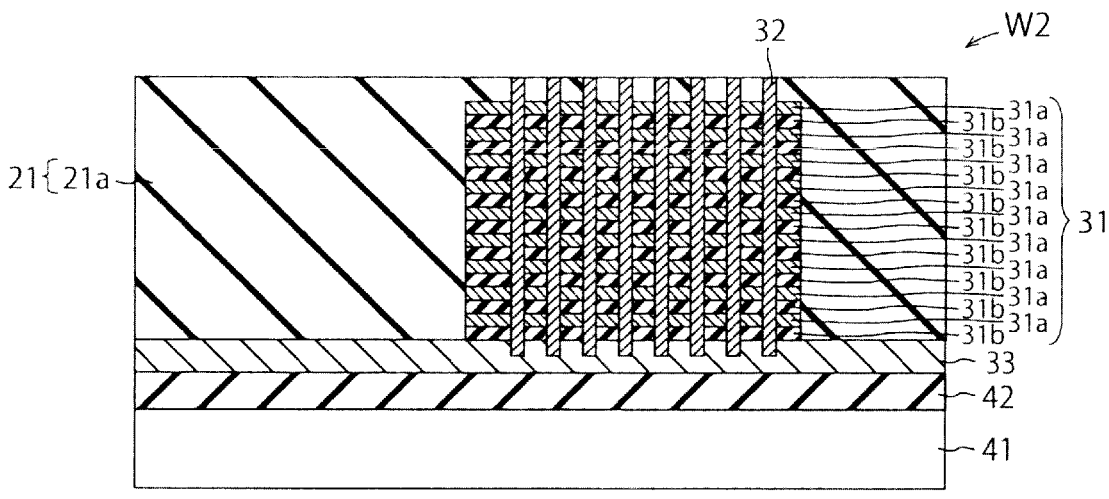

Subsequently, the stacked film 31, the columnar portions 32, and a part of the insulating film 21a for the interlayer insulating film 21 are formed on the wiring layer 33 (FIG. 8B). As a result, a memory cell array including the stacked film 31, the columnar portions 32, and the wiring layer 33 is formed above the substrate 41. Provided that the wiring layer 33 is further etched in a step described below. The stacked film 31 is formed, for example, by alternately stacking a plurality of sacrificial layers and the insulating films 31b and replacing the sacrificial layers by the electrode layers 31a (replacement step). In this case, the columnar portions 32 are formed so as to reach the wiring layer 33 in the stacked film 31 before the replacement step.

Figure 9A:
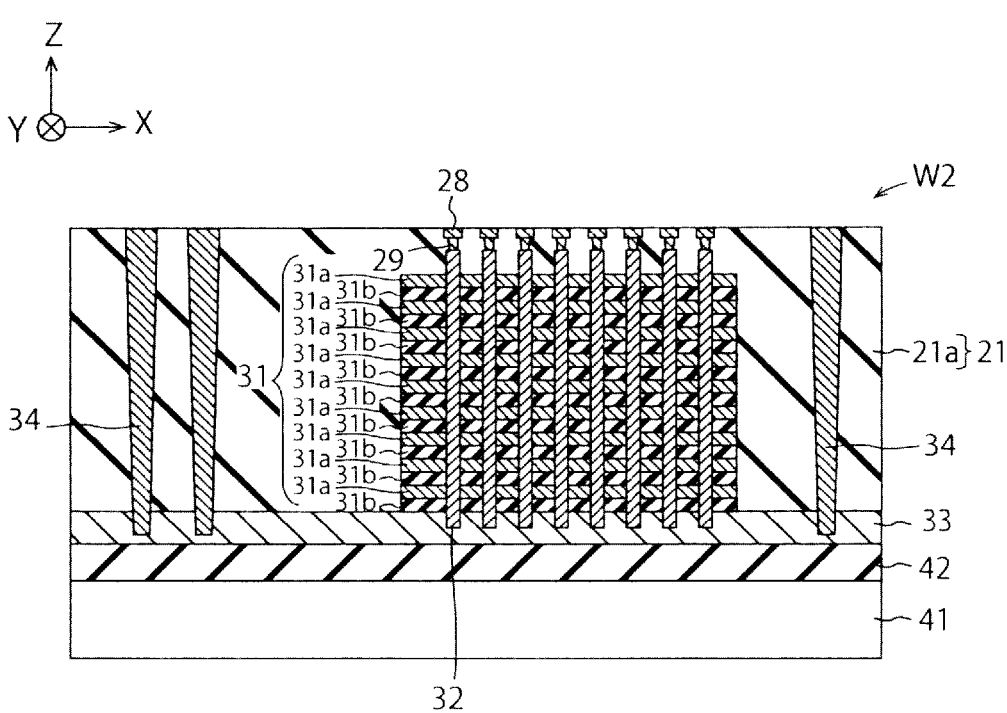
FIGS. 9A and 9B are cross-sectional views illustrating the method for manufacturing a semiconductor device of the second embodiment (2/5).
Figure 9B:
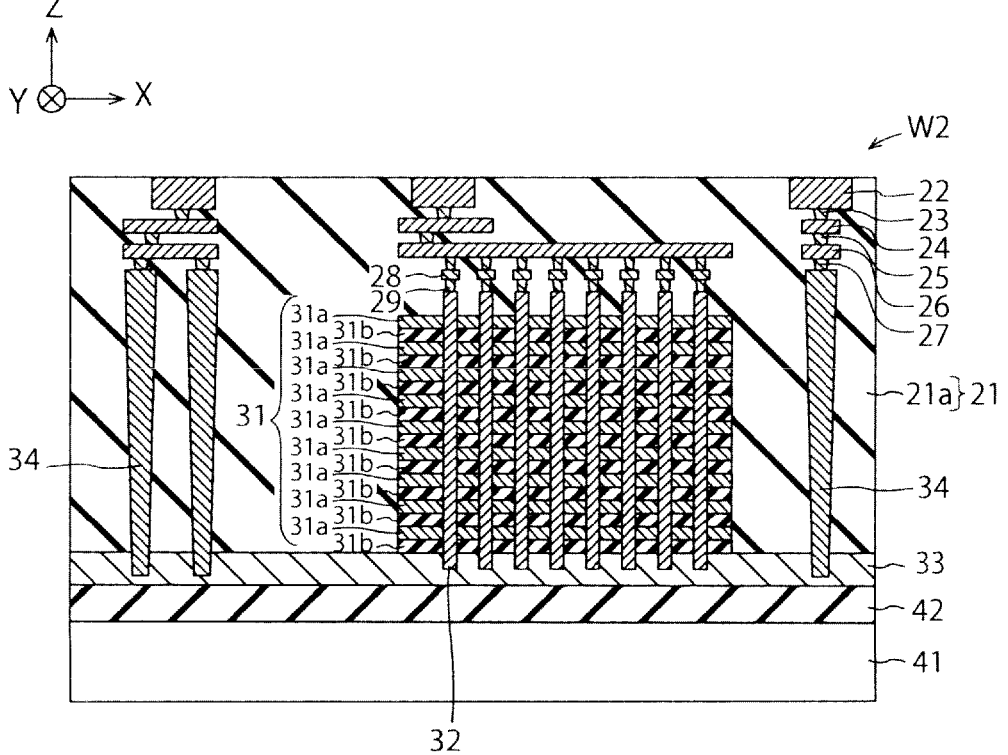

Next, the via plugs 34 are formed so as to reach the wiring layer 33 in the insulating film 21a (FIG. 9A). The contact plugs 29 and the wiring layer 28 are formed sequentially on the columnar portions 32 in the insulating film 21a (FIG. RA).

Subsequently, the balance of the insulating film 21a for the interlayer insulating film 21 is formed over the whole surface of the substrate 41, and the via plugs 27, the wiring layer 26, the via plugs 25, the wiring layer 24, the via plugs 23, and the metal pad 22 are formed sequentially on the via plugs 34 and the wiring layer 28 in the insulating film 21a.

Figure 10:
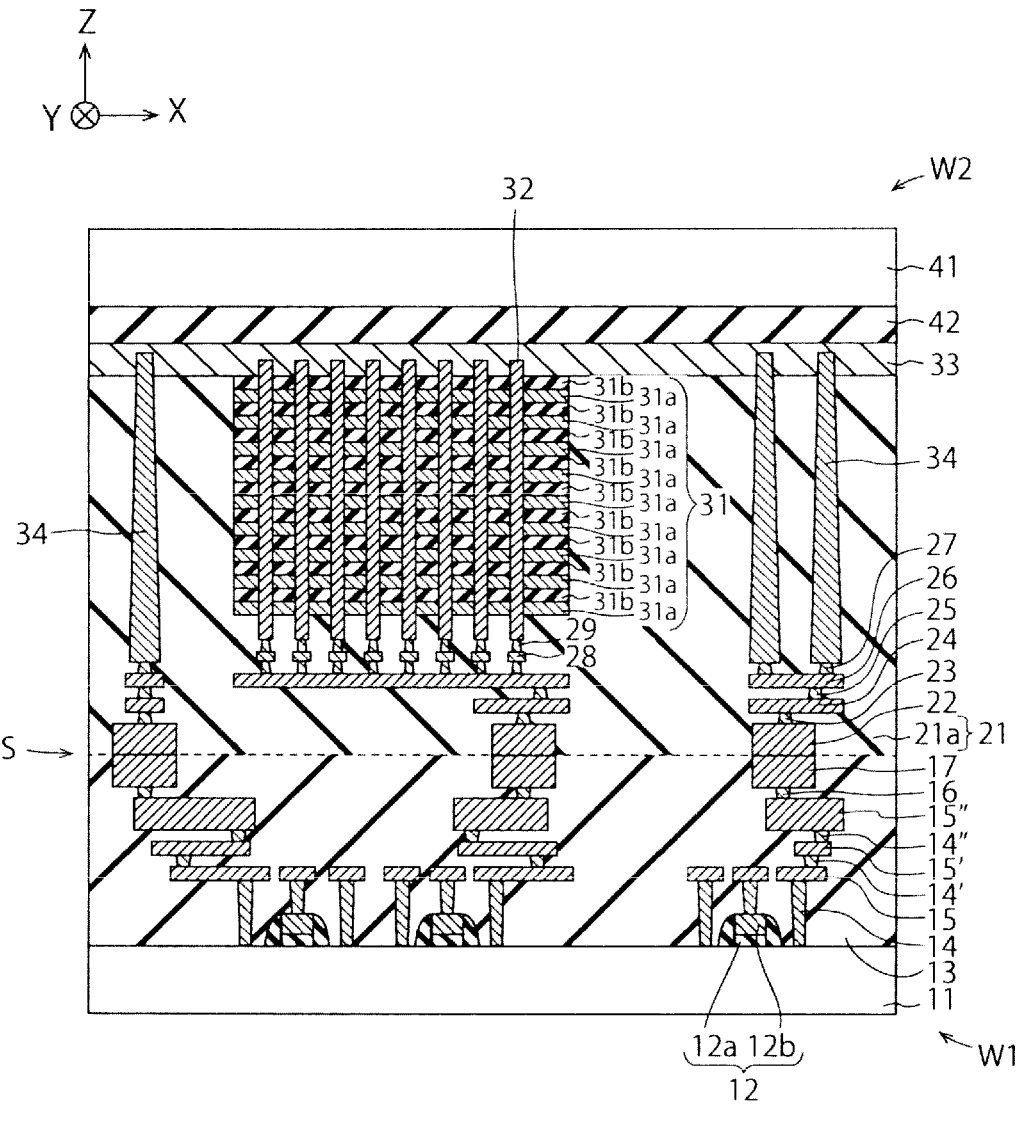
FIG. 10 is a cross-sectional view illustrating the method for manufacturing a semiconductor device of the second embodiment (3/5).

Next, the substrate 11 for the circuit wafer W1 is prepared, and the transistors 12 are formed on the substrate 11 (FIG. 10). The interlayer insulating film 13 is formed over the substrate 11 and the transistors 12, and the contact plugs 14, the wiring layer 15, via plugs 14', a wiring layer 15', via plugs 14", a wiring layer 15", the via plugs 16, and the metal pads 17 are formed sequentially over the substrate 11 or the transistors 12 in the interlayer insulating film 13 (FIG. 10).

Subsequently, the circuit wafer W1 is bonded to the array wafer W2 (FIG. 10). Specifically, the substrate 11 is bonded to the substrate 41 through the interlayer insulating film 13, the insulating film 21a, and the like. As a result, the array wafer W2 is disposed on the circuit wafer W1.

Figure 11A:
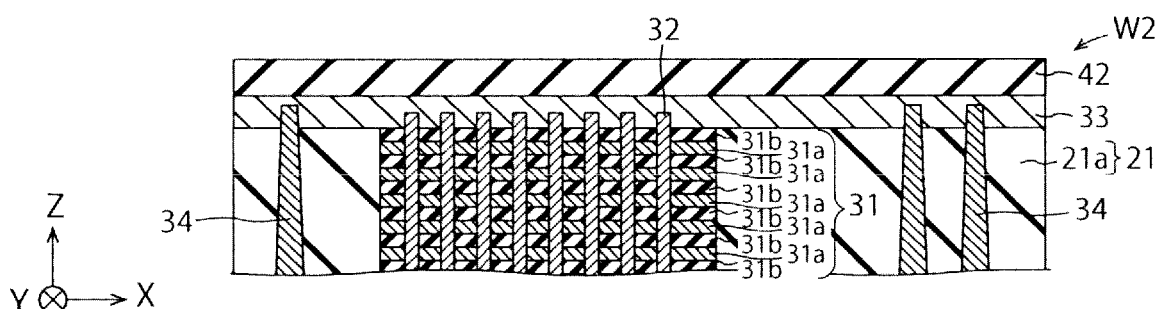
FIGS. 11A, 11B, and 11C are cross-sectional views illustrating the method for manufacturing a semiconductor device of the second embodiment (4/5).

The substrate 41 is then removed by CMP (FIG. 11A). As a result, the upper surface of the insulating film 42 is exposed.

Figure 11B:
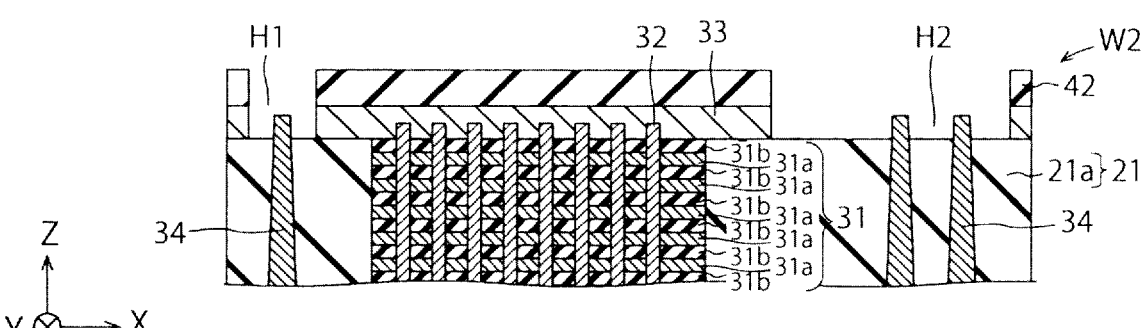

Subsequently, the insulating film 42 and the wiring layer 33 are processed by lithography and reactive ion etching (RIE) (FIG. 11B). As a result, openings H1 and H2 are formed in the insulating film 42 and the wiring layer 33. The via plugs 34 are exposed in the openings H1 and H2.

Figure 11C:
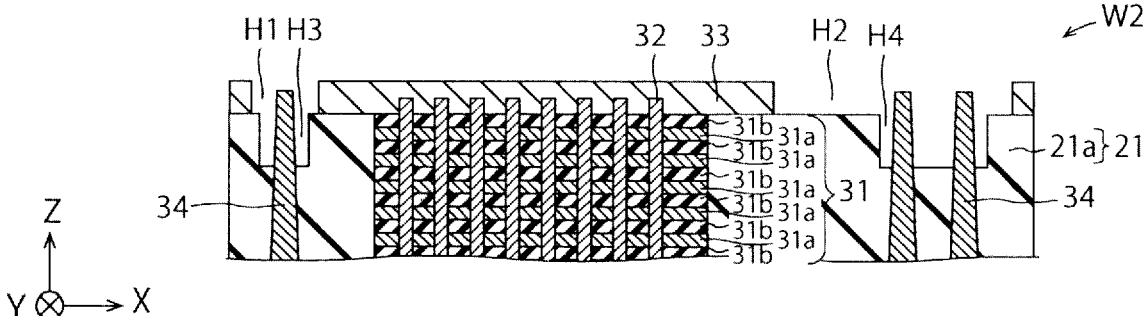

The insulating film 21a within the openings H1 and H2 is then processed by lithography and RIE (FIG. 11C). As a result, an opening H3 is formed in the bottom of the opening H1, and an opening H4 is formed in the bottom of the opening H2. The area of the exposed via plugs 34 is increased. Subsequently, the insulating film 42 is removed.

Figure 12A:
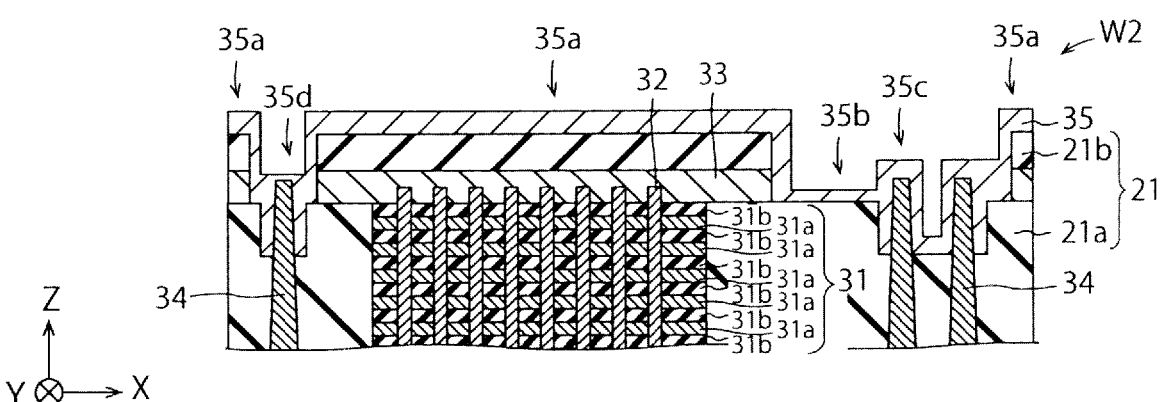
FIGS. 12A, 12B, and 12C are cross-sectional views illustrating the method for manufacturing a semiconductor device of the second embodiment (5/5).

Next, the insulating film 21b for the interlayer insulating film 21 is formed on the wiring layer 33, and the metal wire 35 is formed on the insulating films 21a and 21b and the via plugs 34 (FIG. 12A). The metal wire 35 is, for example, a power supply wire. The metal wire 35 is formed, for example, by forming a wiring layer for the metal wire 35 over the whole surface of the substrate 11 and etching the wiring layer. In this case, the wiring layer may form the power supply wire (metal wire 35) and a signal wire. The insulating film 21b of the embodiment is formed on not only the upper surface of the wiring layer 33 but also the side surface of the wiring layer 33. For example, the insulating film 21b is disposed between the side surface of the wiring layer 33 and the side surface of the metal wire 35 as illustrated in FIG. 12A.

The metal wire 35 of the embodiment is formed such that the flat portion 35a, the wire connection portion 35b, the plug connection portion 35c, the plug connection portion 35d, and the slopes R1 to R3 described with reference to FIGS. 1 and 5 and the like are contained. The plug connection portion 35d is formed on the via plugs 34 in the openings H1 and H3. The plug connection portion 35c is formed on the via plugs 34 in the opening H4 and the like. The wire connection portion 35b is formed in the opening H2. The flat portion 35a is formed on the insulating film 21b. The metal wire 35 of the embodiment is further formed such that the regions 51 to 53 and the corner portions C1 to C4 described with reference to FIG. 5 and the like are contained.

The upper ends of the via plugs 34 may protrude upwardly from the bottom surfaces of the openings H3 and H4, as illustrated in FIG. 12A. In this case, the heights of upper surfaces of the plug connection portions 35c and 35d may be higher than the height of upper surface of the wire connection portion 35b, as illustrated in FIG. 12A.

Figure 12B:
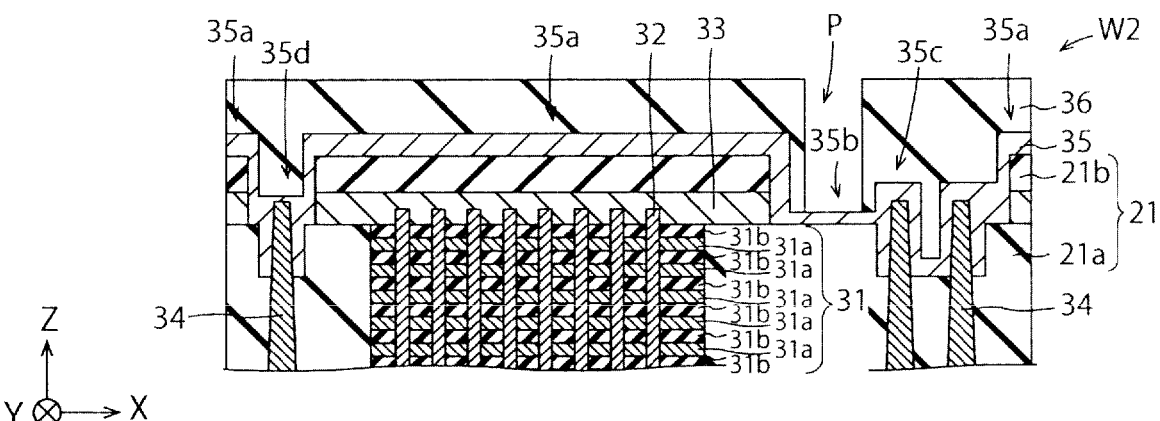

Subsequently, the insulating passivation film 36 is formed over the whole surface of the substrate 11, and the opening P is formed in the insulating passivation film 36 by lithography and RIE (FIG. 12B). As a result, the upper surface of the wire connection portion 35b is exposed in the opening P.

Figure 12C:
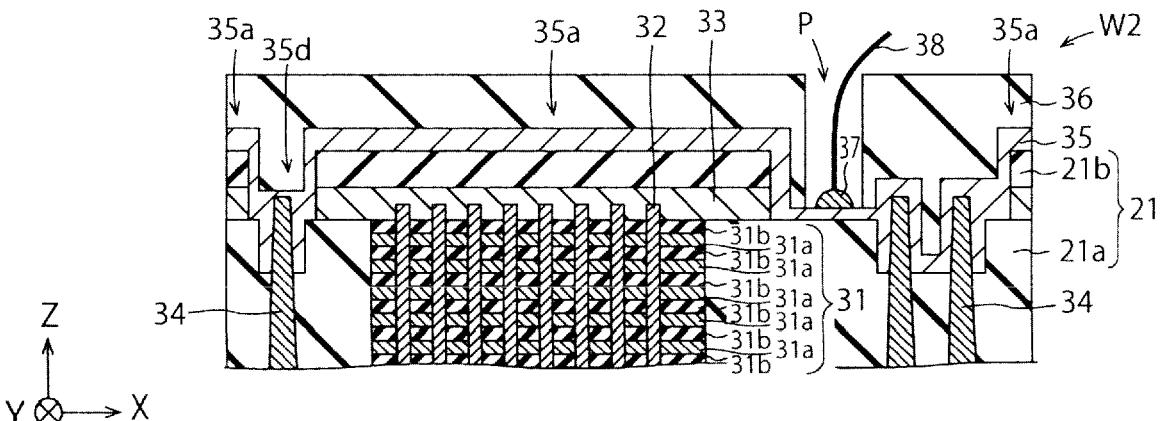

Next, the bonding wire 38 is attached through the solder 37 to the upper surface of the wire connection portion 35b in the opening P (FIG. 12C). As a result, the bonding wire 38 is electrically connected to the wire connection portion 35b through the solder 37.

After that, the circuit wafer W1 and the array wafer W2 are cut into a plurality of chips. Thus, the semiconductor device of the embodiment is manufactured.

As described above, according to the embodiment, the semiconductor device of the first embodiment can be manufactured. This makes it possible to form the metal wire 35 having a suitable configuration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first substrate;
a transistor disposed on the first substrate;
a memory cell array disposed above the transistor; and
a metal layer disposed above the transistor, wherein the metal layer includes
a first region extending in a first direction,
a second region that has a width in the first direction smaller than the first region, protrudes from the first region in a second direction intersecting the first direction, and includes a wire connection portion,
a first corner portion provided between a proximal end portion of the second region and the first region and having an angle larger than 180° as viewed in a third direction intersecting the first direction and the second direction,
wherein the second region includes a first portion that has a lower surface at a first height and a second portion that has a lower surface at a second height lower than the first height, and a step at a boundary between the first portion and the second portion, and
the step is disposed farther away from an edge of the second region at a first position adjacent the first corner portion in the second direction and adjacent to the edge of the second region at a second position farther away from the first corner portion than the first position.

2. The semiconductor device according to claim 1, wherein the metal layer further includes a third region extending from the first region to a side opposite to the second region.

3. The semiconductor device according to claim 1, wherein a distance between the second portion and the first corner portion as viewed in the third direction is 1 μm or more.

4. The semiconductor device according to claim 1, wherein the metal layer further includes a first slope, the first slope connecting the first portion to the second portion and being angled between the first portion and the second portion.

5. The semiconductor device according to claim 1, wherein the second portion has a shape such that a corner on a side of the first corner portion is depressed as viewed in the third direction.

6. The semiconductor device according to claim 1, wherein the metal layer further includes a third portion disposed within the second region and having a lower surface at a third height lower than the second height.

7. The semiconductor device according to claim 6, wherein a distance between the third portion and the first corner portion as viewed in the third direction is 1 μm or more.

8. The semiconductor device according to claim 6, further comprising a first via plug disposed under the third portion.

9. The semiconductor device according to claim 6, wherein the metal layer further includes a second slope, the second slope connecting the second portion to the third portion and being angled between the second portion and the third portion.

10. The semiconductor device according to claim 2, wherein the metal layer further includes a fourth portion disposed within the third region and having a lower surface at a fourth height lower than the first height.

11. The semiconductor device according to claim 10, further comprising a second via plug disposed under the fourth portion.

12. The semiconductor device according to claim 1, wherein the second region has a second corner portion having an angle smaller than 180° as viewed in the third direction, the second corner portion disposed at a tip end, wherein a distance between the second portion and the first corner portion is longer than a distance between the second portion and the second corner portion as viewed in the third direction.

\* \* \* \* \*